(12) United States Patent
Seo et al.

(10) Patent No.: US 11,502,697 B2
(45) Date of Patent: Nov. 15, 2022

(54) ANALOG-TO-DIGITAL CONVERTER CIRCUIT AND IMAGE SENSOR

(71) Applicant: SK hynix Inc., Gyeonggi-do (KR)

(72) Inventors: Sung Uk Seo, Gyeonggi-do (KR); Han Sang Kim, Gyeonggi-do (KR); Yu Jin Park, Gyeonggi-do (KR); Jeong Eun Song, Gyeonggi-do (KR); Min Seok Shin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 130 days.

(21) Appl. No.: 17/143,255

(22) Filed: Jan. 7, 2021

(65) Prior Publication Data
US 2022/0077870 A1    Mar. 10, 2022

(30) Foreign Application Priority Data
Sep. 9, 2020   (KR) .......................... 10-2020-0115427

(51) Int. Cl.
| | |
|---|---|
| *H03M 1/56* | (2006.01) |
| *H03M 1/12* | (2006.01) |
| *H04N 5/357* | (2011.01) |
| *H04N 5/374* | (2011.01) |
| *H01L 27/146* | (2006.01) |
| *H03F 1/26* | (2006.01) |
| *H04N 5/3745* | (2011.01) |

(52) U.S. Cl.
CPC ........ *H03M 1/56* (2013.01); *H01L 27/14612* (2013.01); *H04N 5/357* (2013.01); *H04N 5/37455* (2013.01); *H04N 5/37457* (2013.01)

(58) Field of Classification Search
CPC ............... H04N 5/357; H04N 5/37455; H04N 5/37457; H04N 5/3741; H04N 5/378; H04N 5/3455; H04N 5/361; H04N 5/36963; H01L 27/14612; H03F 1/26; H03F 5/88; H03M 1/52; H03M 1/0607
See application file for complete search history.

(56) References Cited

U.S. PATENT DOCUMENTS

| | | | |
|---|---|---|---|
| 10,250,826 B2 | 4/2019 | Mandelli et al. | |
| 11,121,687 B1* | 9/2021 | Biswas | ............... H03F 3/45085 |
| 2012/0147922 A1* | 6/2012 | Lau | ......................... H03F 3/373 |
| | | | 374/158 |
| 2013/0182157 A1* | 7/2013 | Ono | ............................. 348/294 |

(Continued)

FOREIGN PATENT DOCUMENTS

KR    10-1948651    2/2019

*Primary Examiner* — Marly S Camargo
(74) *Attorney, Agent, or Firm* — IP & T Group LLP

(57) ABSTRACT

An analog-to-digital converter circuit includes: a first operation amplifier suitable for comparing a ramp voltage and a voltage to be converted so as to produce an amplification result and outputting the amplification result; a second operation amplifier suitable for comparing the amplification result transferred to a first input terminal with a reference voltage transferred to a second input terminal so as to produce a comparison result and outputting the comparison result; a leakage current measurer suitable for measuring a leakage current to the first input terminal; and a leakage current generator suitable for causing a current of the same amount as that of the leakage current measured by the leakage current measurer to flow to the second input terminal.

18 Claims, 6 Drawing Sheets

(56) References Cited

U.S. PATENT DOCUMENTS

2018/0109744 A1* 4/2018 Hanzawa ............... H04B 5/357
2018/0124345 A1* 5/2018 Aoki ..................... H04N 5/378
2022/0060649 A1* 2/2022 Adusumalli ....... H04N 5/37455

* cited by examiner

ANALOG-TO-DIGITAL CONVERTER CIRCUIT AND IMAGE SENSOR

CROSS-REFERENCE TO RELATED APPLICATION

The present application claims priority under 35 U.S.C. § 119 on Korean Patent Application No. 10-2020-0115427, filed on Sep. 9, 2020, which is incorporated herein by reference in its entirety.

BACKGROUND

1. Field

Various embodiments of the present invention relate to an image sensor.

2. Description of the Related Art

In a CMOS image sensor (CIS), there is a trade-off between speed and power. Therefore, recent CMOS image sensors mainly adopt a column-parallel structure to obtain an optimal speed, power trade-off relationship, which increases the difficulty of integrating an Analog-to-Digital Converter (ADC) into a narrow pixel width. Therefore, a simple type of a Single-Slope Analog-to-Digital Converter (ADC) is mostly used.

Delta Reset Sampling (DRS) is an example of Correlated Double Sampling (CDS), which is a method of removing reset noise from pixel signals by reading out a reset value of pixels after reading out the pixel signals and then subtracting two components.

SUMMARY

Embodiments of the present invention are directed to an image sensor that converts pixel signals into digital images with a high accuracy.

In accordance with an embodiment of the present invention, an analog-to-digital converter circuit includes: a first operation amplifier suitable for comparing a ramp voltage and a voltage to be converted so as to produce an amplification result and outputting the amplification result; a second operation amplifier suitable for comparing the amplification result transferred to a first input terminal with a reference voltage transferred to a second input terminal so as to produce a comparison result and outputting the comparison result; a leakage current measurer suitable for measuring a leakage current to the first input terminal; and a leakage current generator suitable for causing a current of the same amount as that of the leakage current measured by the leakage current measurer to flow to the second input terminal.

In accordance with another embodiment of the present invention, an image sensor includes: a pixel circuit; a first operation amplifier suitable for comparing a ramp voltage with an output voltage of the pixel so as to produce a amplification result and outputting the amplification result; a second operation amplifier suitable for comparing the amplification result transferred to a first input terminal with a reference voltage transferred to a second input terminal so as to produce a comparison result and outputting the comparison result; a leakage current measurer suitable for measuring a leakage current to the first input terminal; a leakage current generator suitable for causing a current of the same amount as that of the leakage current measured by the leakage current measurer to flow to the second input terminal; and a digital code generation circuit suitable for generating image data by using the comparison result.

In accordance with another embodiment of the present invention, a semiconductor device includes: an amplifying circuit suitable for performing an auto-zeroing operation, and amplifying a voltage difference between an input signal provided to a first input node of the amplifying circuit and a reference signal provided to a second input node of the amplifying circuit; and a leakage current providing circuit suitable for providing a second leakage current to the second input node, wherein the second leakage current is substantially the same as a first leakage current that flows to the first input node when a voltage level of the first input node drops below a ground voltage.

DETAILED DESCRIPTION

Figure 1:
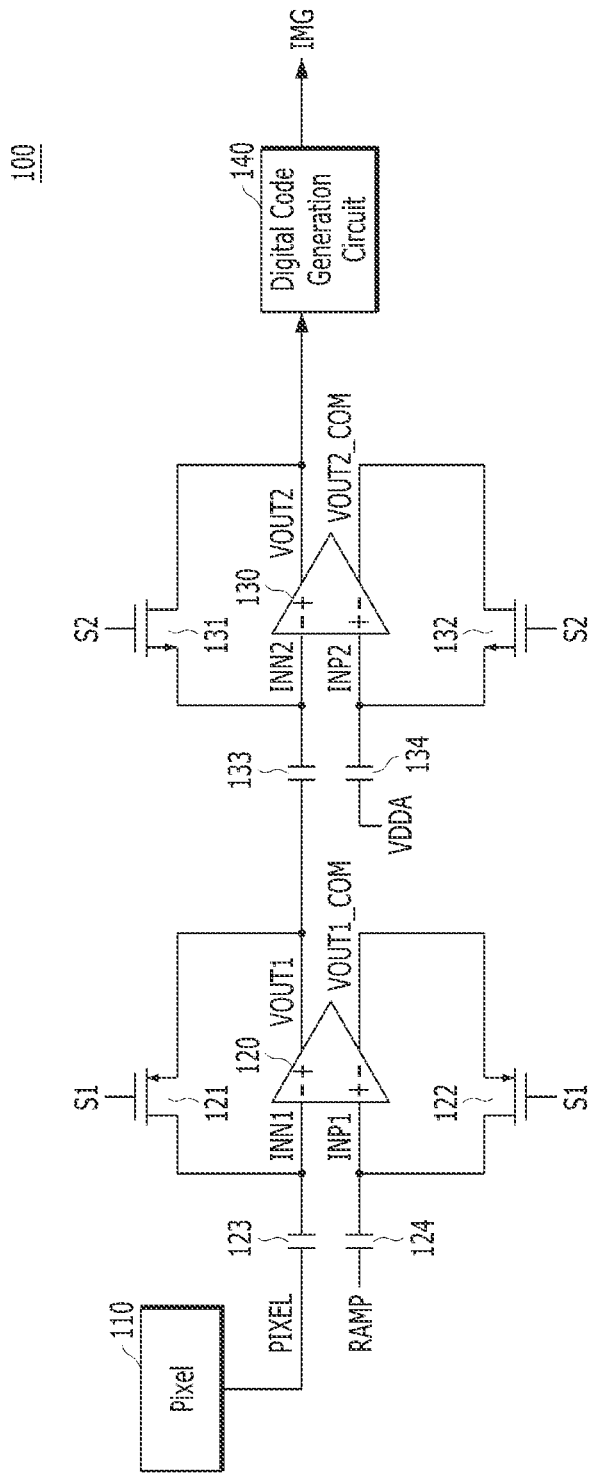
FIG. 1 is a block diagram illustrating an image sensor in accordance with an embodiment of the present invention.

Various embodiments of the present invention are described below in more detail with reference to the accompanying drawings. The present invention may, however, be embodied in different forms and thus is not limited to the embodiments set forth herein. Rather, these embodiments are provided so that this disclosure is thorough and complete, and fully conveys the scope of the present invention to those skilled in the art. Throughout the disclosure, like reference numerals refer to like parts throughout the various figures and embodiments of the present invention. Also, throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

FIG. 1 is a block diagram illustrating an image sensor 100 in accordance with an embodiment of the present invention.

Referring to FIG. 1, the image sensor 100 may include a pixel circuit 110, a first operation amplifier 120, a second operation amplifier 130, a digital code generation circuit 140, switches 121, 122, 131 and 132, and capacitors 123, 124, 133 and 134.

The pixel circuit 110 may output a pixel signal PIXEL representing sensed light of a pixel of an image. An image to be captured and processed by the image sensor 100 may be in the form of an array including a plurality of pixels arranged in a row-column format. The image sensor 100 may have a plurality of pixel circuits 100, each of which may have the same configuration. For clarity and by way of example, only one pixel circuit 100 is shown.

The first operation amplifier 120 may receive a pixel signal PIXEL and a ramp voltage RAMP through the capacitors 123 and 124, respectively. The first operation amplifier 120 may compare the pixel signal PIXEL input to the input terminal INN1 through the capacitor 123 with the level of the ramp voltage RAMP input to the input terminal INP1 through the capacitor 124, and output the comparison result to an output terminal VOUT1. The input terminal INN1 may be a negative (−) input terminal, and the input terminal INP1 may be a positive (+) input terminal. The output terminal VOUT1 may be a positive (+) output terminal, and an output terminal VOUT1_COM may be a negative (−) output terminal.

The second operation amplifier 130 may receive an output VOUT1 of the first operation amplifier 120 through the capacitor 133 at an input terminal INN2 and receive a reference voltage through the capacitor 134 at a second input terminal INP2. Here, a power supply voltage VDDA may be used as a reference voltage. The second operation amplifier 130 may compare the voltage level of the input terminal INN2 with the voltage level of the input terminal INP2 and output the comparison result to the output terminal VOUT2. The input terminal INN2 may be a negative (−) input terminal, and the input terminal INP2 may be a positive (+) input terminal, and the output terminal VOUT2 may be a positive (+) output terminal, and the output terminal VOUT2_COM may be a negative (−) output terminal.

The switches 121, 122, 131 and 132 may be for an auto-zeroing operation of the operation amplifiers 120 and 130. During the auto-zeroing operation, the switches 121, 122, 131 and 132 may be turned on. The switch 121 may electrically connect the input terminal INN1 of the first operation amplifier 120 to the output terminal VOUT1, and the switch 122 may electrically connect the input terminal INP1 of the first operation amplifier 120 to the output terminal VOUT1_COM. The switch 131 may electrically connect the input terminal INN2 of the second operation amplifier 130 to the output terminal VOUT2, and the switch 132 may electrically connect the input terminal INP2 of the second operation amplifier 130 to the output terminal VOUT2_COM. Each of the switches 121 and 122 may include a PMOS transistor, and each of the switches 131 and 132 may include an NMOS transistor. Here, each of the switches 121, 122, 131 and 132 is illustrated to have one transistor, but the invention is not limited to that configuration; each of the switches 121, 122, 131 and 132 may be formed to have two or more transistors. A signal S1 may be activated to a low level during an auto-zeroing operation so as to turn on the switches 121 and 122, and a signal S2 may be activated to a high level during the auto-zeroing operation so as to turn on the switches 131 and 132.

The digital code generation circuit 140 may generate image data IMG by using a signal of the output terminal VOUT2 of the second operation amplifier 130. A pixel signal corresponding to the sensed light may be output first from the pixel circuit 110, and then a reset signal may be output from the pixel circuit 110. The second operation amplifier 130 may output a comparison result obtained by comparing the pixel signal with the ramp voltage first, and then output a comparison result obtained by comparing the reset signal with the ramp voltage. The digital code generation circuit 140 may generate the image data IMG, which are digital information corresponding to a value obtained by subtracting the reset signal from the pixel signal based on the output of the second operation amplifier 130.

Figure 2:
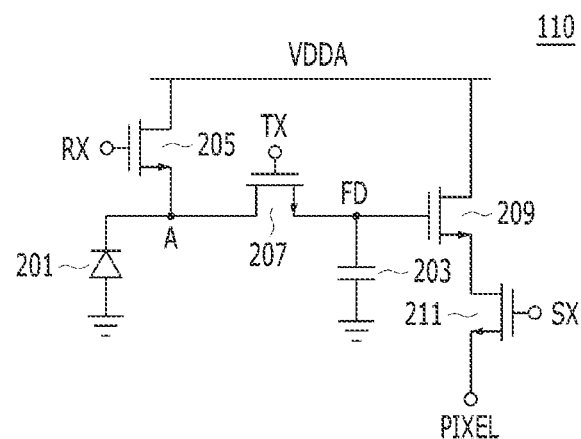
FIG. 2 is a block diagram illustrating a pixel circuit.

FIG. 2 is a block diagram illustrating the pixel circuit 110 shown in FIG. 1.

Referring to FIG. 2, the pixel circuit 110 may include a photo sensor 201, a capacitor 203, a reset transistor 205, a transfer transistor 207, a driving transistor 209, and a selection transistor 211.

The photo sensor 201 may perform a photoelectric conversion function. The photo sensor 201 may be coupled between a ground voltage terminal and a node A. The photo sensor 201 may receive light from the outside and generate photo charges based on the received light. The photo sensor 201 may be formed as a photo diode, a photo transistor, a photo gate, a pinned photo diode, or any combination thereof.

The reset transistor 205 may transfer the power supply voltage VDDA to the node A in response to a reset signal RX. During a reset operation, since both of the reset signal RX and a transfer signal TX are activated, the reset transistor 205 and the transfer transistor 207 may be all turned on. Therefore, the photo charges stored in a floating diffusion node FD may be reset by the reset operation.

The transfer transistor 207 may electrically connect the node A to which the photo sensor 201 is coupled and the floating diffusion node FD to each other in response to the transfer signal TX.

The floating diffusion node FD may be a node in which charges corresponding to the light sensed by the photo sensor 201 or charges corresponding to an initialization voltage are accumulated. The capacitor 203 may be coupled to the floating diffusion node FD.

The driving transistor 209 may have a gate that is coupled to the floating diffusion node FD and have a drain and a source that are coupled between the power supply voltage terminal VDDA and the selection transistor 211. The driving transistor 209 may amplify the voltage of the floating diffusion node FD.

The selection transistor 211 may output a voltage amplified by the driving transistor 209 as a pixel signal PIXEL in response to a selection signal SX.

Figure 3:
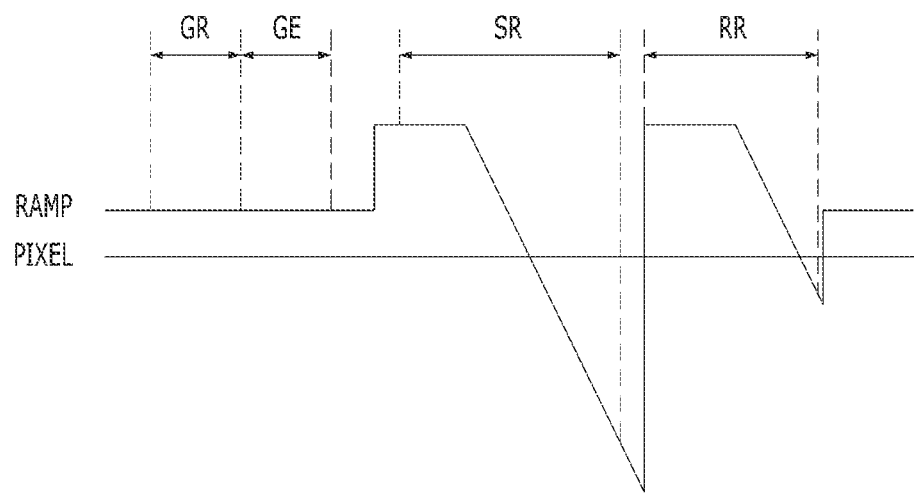
FIG. 3 illustrates a ramp voltage and an output voltage of a pixel circuit of an image sensor, such as that shown in FIG. 1.

FIG. 3 illustrates a ramp voltage RAMP and an output voltage PIXEL of a pixel of the image sensor 100 shown in FIG. 1.

Referring to FIG. 3, 'GR' may denote a global reset time period. During GR, both of the reset signal RX and the transfer signal TX may be activated to a high level so as to turn on both of the reset transistor 205 and the transfer transistor 207. Accordingly, the floating diffusion node FD of the pixel circuit 110 may be reset.

'GE' may represent a global exposure time period. During GE, the reset signal RX may be deactivated to a low level so as to turn off the reset transistor 205, and the transfer signal TX may be activated to a high level so as to turn on the transfer transistor 207. Accordingly, photo charges due to the light sensed by the photo sensor 201 may be transferred to the floating diffusion node FD.

The first operation amplifier 120 and the second operation amplifier 130 may perform an auto-zeroing operation after the global exposure time period GE and before a signal readout time period SR. During the auto-zeroing operation, all of the switches 121, 122, 131 and 132 may be turned on.

'SR' may represent a signal readout time period. During this time period, the reset signal RX and the transfer signal TX may be deactivated to a low level so as to turn off the reset transistor 205 and the transfer transistor 207, and the selection signal SX may be activated so as to turn on the selection transistor 211. Accordingly, a voltage corresponding to the photo charges stored in the floating diffusion node FD may be output from the pixel circuit 110. In other words, the output voltage PIXEL of the pixel circuit 110 here may be a voltage corresponding to a pixel signal. From the time at which the ramp voltage RAMP begins to fall in the signal readout time period SR to the time at which the ramp voltage RAMP is the same as the output voltage PIXEL, that is, until the voltage level of the output terminal of the second operation amplifier VOUT2 is inverted, the digital code generation circuit 140 may generate a digital code corresponding to a pixel signal by counting a clock.

'RR' may represent a reset readout time period. During this time period, the reset signal RX and the transfer signal TX may be activated to a high level so as to turn on the reset transistor 205 and the transfer transistor 207, and the selection signal SX may be activated so as to turn on the selection transistor 211. Accordingly, the floating diffusion node FD may be reset, and a voltage corresponding to the reset floating diffusion node may be output from the pixel circuit 110. In other words, the output voltage PIXEL of the pixel circuit 110 here may be a voltage corresponding to the reset value. From a moment when the ramp voltage RAMP begins to fall in the reset readout time period RR to a moment when the ramp voltage RAMP meets the output voltage PIXEL of the pixel, that is until the voltage level of the output terminal of the second operation amplifier VOUT2 is inverted, the digital code generation circuit 140 may generate a digital code corresponding to a reset value by counting the clock.

The digital code generation circuit 140 may subtract a value of a digital code corresponding to the reset value generated in the reset readout time period RR from the value of a digital code corresponding to the pixel signal generated in the signal readout time period SR to generate image data IMG corresponding to the subtracted value.

Figure 4:
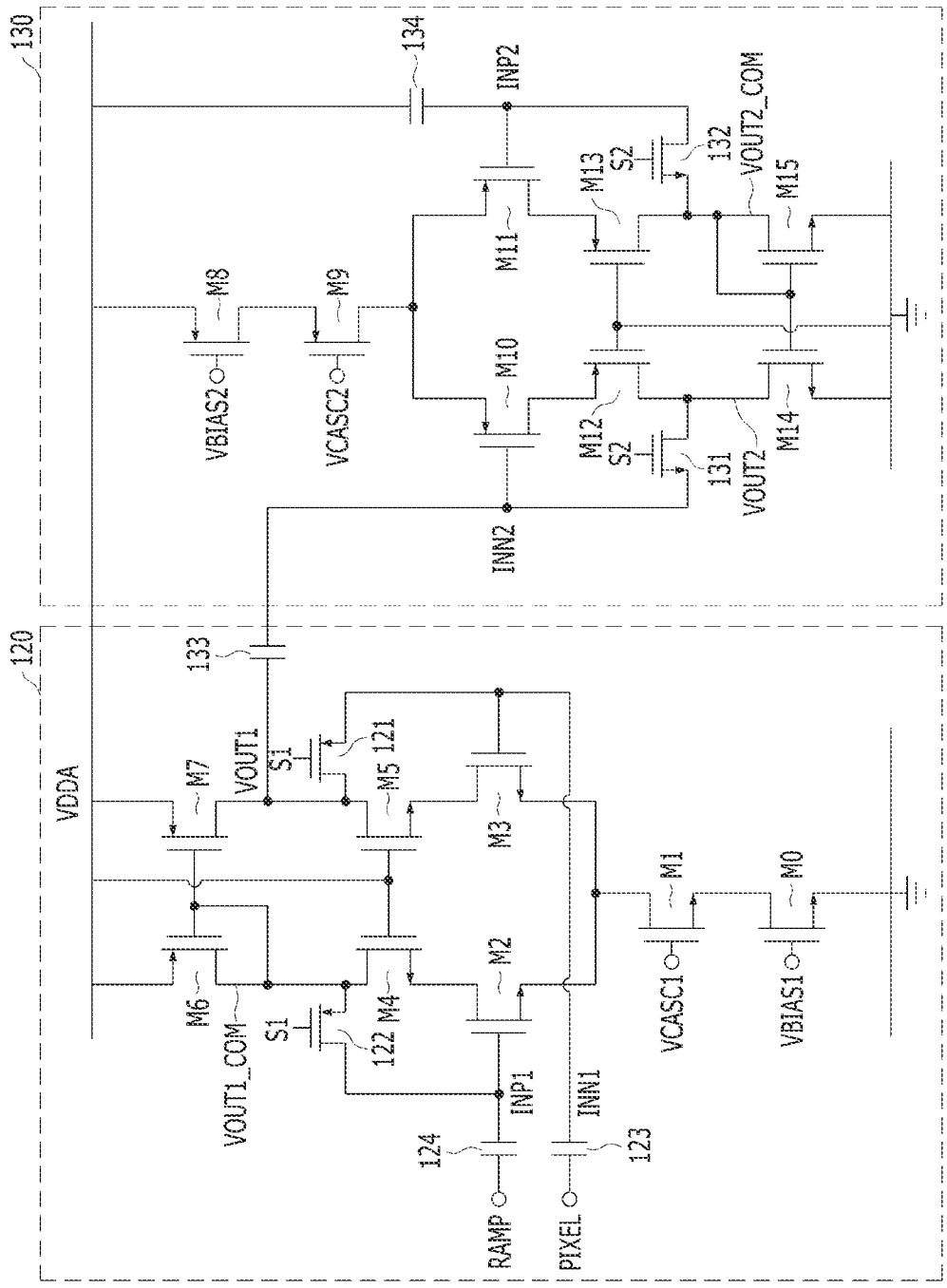
FIG. 4 is a block diagram illustrating a first operation amplifier and a second operation amplifier, such as those shown in FIG. 1.

FIG. 4 is a block diagram illustrating the first operation amplifier 120 and the second operation amplifier 130 shown in FIG. 1. In FIG. 4, the switches 121, 122, 131 and 132 and the capacitors 123, 124, 133 and 134 are illustrated.

Referring to FIG. 4, the first operation amplifier 120 may include NMOS transistors M0 to M5 and PMOS transistors M6 and M7. The NMOS transistors M0 and M1 may adjust the amount of current flowing through the first operation amplifier 120 in response to bias voltages VBIAS1 and VCASC1. The NMOS transistors M2 and M3 may be used to receive signals from the input terminals INN1 and INP1. The NMOS transistors M4 and M5 and the PMOS transistors M6 and M7 may be used to differentially amplify the signals input through the NMOS transistors M2 and M3.

The second operation amplifier 130 may include PMOS transistors M8 to M13 and NMOS transistors M14 and M15. The PMOS transistors M8 and M9 may adjust the amount of current flowing through the second operation amplifier 130 in response to bias voltages VBIAS2 and VCASC2. The PMOS transistors M10 and M11 may be used to receive signals from the input terminals INN2 and INP2. The PMOS transistors M12 and M13 and the NMOS transistors M14 and M15 may be used to differentially amplify signals input through the PMOS transistors M10 and M11.

The transistors coupled to the input terminals INN1 and INP1 in the first operation amplifier 120 may be NMOS transistors M2 and M3, and the transistors coupled to the input terminals INN2 and INP2 in the second operation amplifier 130 may be PMOS transistors M10 and M11. When the switches 121, 122, 131 and 132 are turned on for this reason and thereby an auto-zeroing operation is performed, the input terminals INN1 and INP1 and the output terminals VOUT1 and VOUT1_COM of the first operation amplifier 120 may be a level of 'VDDA-Vthp', and the input terminals INN2 and INP2 and the output terminals VOUT2 and VOUT2_COM of the second operation amplifier 130 may be a level of 'Vthn'. Here, Vthn may be a threshold voltage of the NMOS transistors, and Vthp may be a threshold voltage of the PMOS transistors.

Figure 5:
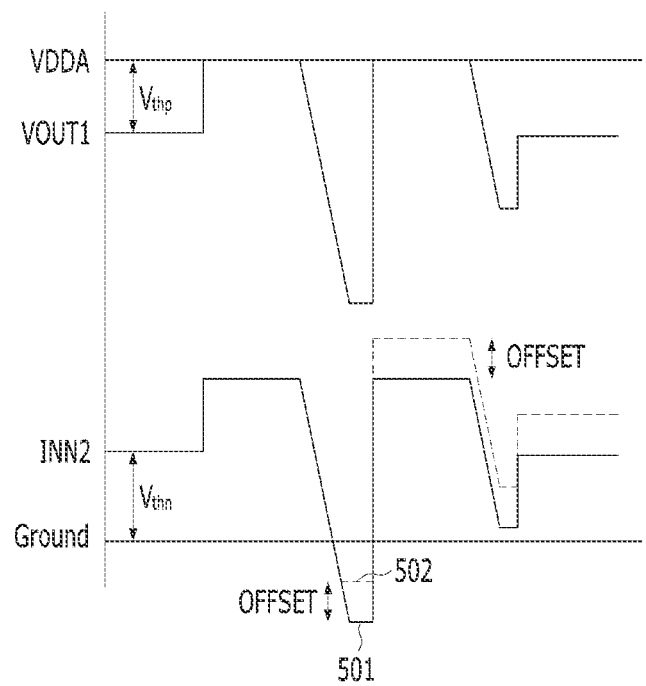
FIG. 5 illustrates how voltage at an output terminal of a first operation amplifier and voltage at an input terminal of a second operation amplifier change when a ramp voltage varies as shown in FIG. 3.

FIG. 5 illustrates how the output terminal VOUT1 of the first operation amplifier and at the input terminal INN2 of the second operation amplifier change when the ramp voltage RAMP varies as shown in FIG. 3.

Referring to FIG. 5, the voltage level at the output terminal VOUT1 of the first operation amplifier 120 may begin to move from 'VDDA-Vthp', which is an auto-zeroed level, and the voltage level at the input terminal INN2 of the second operation amplifier 130 may begin to move from 'Vthn', which is an auto-zeroed level. Although the voltage levels of the two terminals VOUT1 and INN2 are different, the two terminals may be coupled by the capacitor 133. Therefore, they are supposed to swing the same or substantially the same.

Since the swing width of the ramp voltage RAMP is large, the swing width of the output terminal VOUT1 may also be large. When the input terminal INN2 swings the same as the output terminal VOUT1, the input terminal INN2 may have to swing to a level 501 below a ground voltage Ground. However, when the voltage level of the input terminal INN2 falls to a level below the ground voltage, a leakage current may flow from the switch 131 to the input terminal INN2, which causes the voltage level of the input terminal INN2 to swing only up to a level 502. As the voltage level of the input terminal INN2 goes down to a negative level, a forward bias may be generated at a PN junction of the NMOS transistor which forms the switch 131. This may cause a leakage current to flow from the switch 131 to the input terminal INN2, and as a result, the voltage level of the input terminal INN2 may increase.

When the voltage of the input terminal INN2 does not swing to the level 501 and only swings to the level 502 due to the leakage current, the voltage level of the input terminal INN2 may not fluctuate as shown by the solid line in FIG. 5, but fluctuate as shown by the dotted line in FIG. 5, thus causing an error in a reset readout operation. The offset OFFSET in the drawing may represent a variation in the voltage level of the input terminal INN2 due to the leakage current, and an error may occur in a reset readout operation as much as the offset value.

Figure 6:
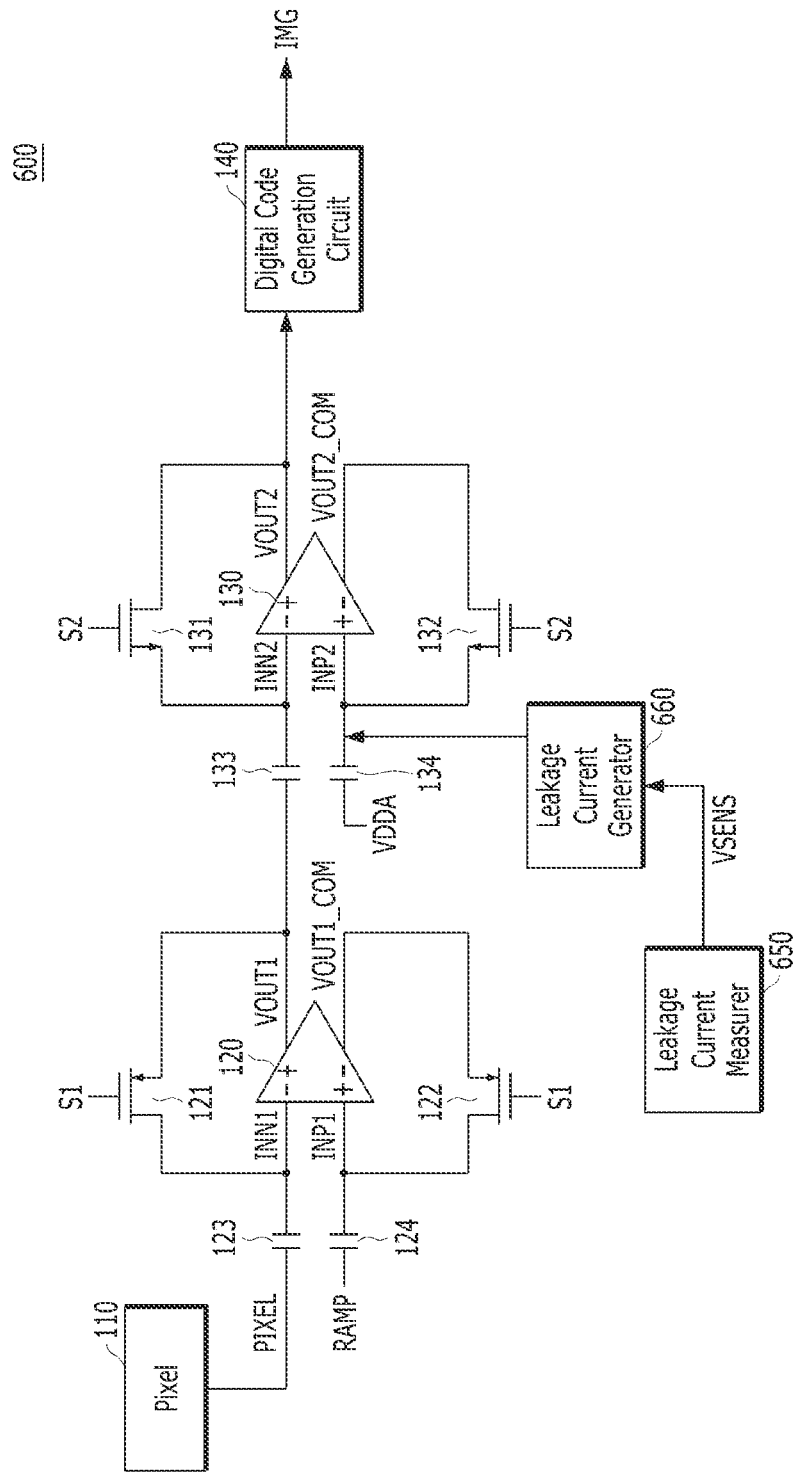
FIG. 6 is a block diagram illustrating an image sensor in accordance with another embodiment of the present invention.

FIG. 6 is a block diagram illustrating an image sensor 600 in accordance with another embodiment of the present invention.

Referring to FIG. 6, the image sensor 600 may include a pixel circuit 110, a first operation amplifier 120, a second operation amplifier 130, a digital code generation circuit 140, switches 121, 122, 131 and 132, and capacitors 123, 124, 133 and 134, a leakage current measurer 650, and a leakage current generator 660. In other words, compared to the image sensor 100 of FIG. 1, the image sensor 600 of FIG. 6 may further include a leakage current measurer 650 and a leakage current generator 660.

The leakage current measurer 650 may measure a leakage current flowing to the input terminal INN2 of the second operation amplifier 130. As illustrated in FIG. 5, as the voltage level of the input terminal INN2 is lowered to a negative level below the ground voltage, a leakage current may flow from the switch 131 to the input terminal INN2. The leakage current measurer 650 may measure the amount of the leakage current. The leakage current measurer 650 may directly or indirectly measure the leakage current flowing through the input terminal INN2.

The leakage current generator 660 may provide, to the input terminal INP2, a current of the same amount as that of leakage current measured by the leakage current measurer 650. Since the leakage current generator 660 provides, to the input terminal INP2, leakage current the amount of which is the same as the leakage current generated in the input terminal INN2, offset of the same amount as the input terminal INN2 may occur in the input terminal INP2. Since the second operation amplifier 130 is a differential amplifier, it may amplify difference between the voltages at the input terminals INN2 and INP2. When the offsets of the same amount occur in all the input terminals INN2 and INP2, the second operation amplifier 130 may output the same result as when no offset occurs at either the input terminals INN2 and INP2.

The amount of leakage current flowing through the input terminal INN2 is measured by using the leakage current measurer 650, and when the leakage current generator 660 is used to cause the same amount of leakage current to flow to the input terminal INP2 as flows to the input terminal INN2, the problem caused by the offset which is described in FIG. 5 may be solved.

In the image sensor 600 of FIG. 6, the constituent elements, except for the pixel circuit 110, may be for converting an analog voltage PIXEL output from the pixel circuit 110 into image data IMG, which is a digital code. Therefore, the present invention may be applied not only to an image sensor but also to a general analog-to-digital converter circuit for converting an analog voltage into a digital code.

Figure 7:
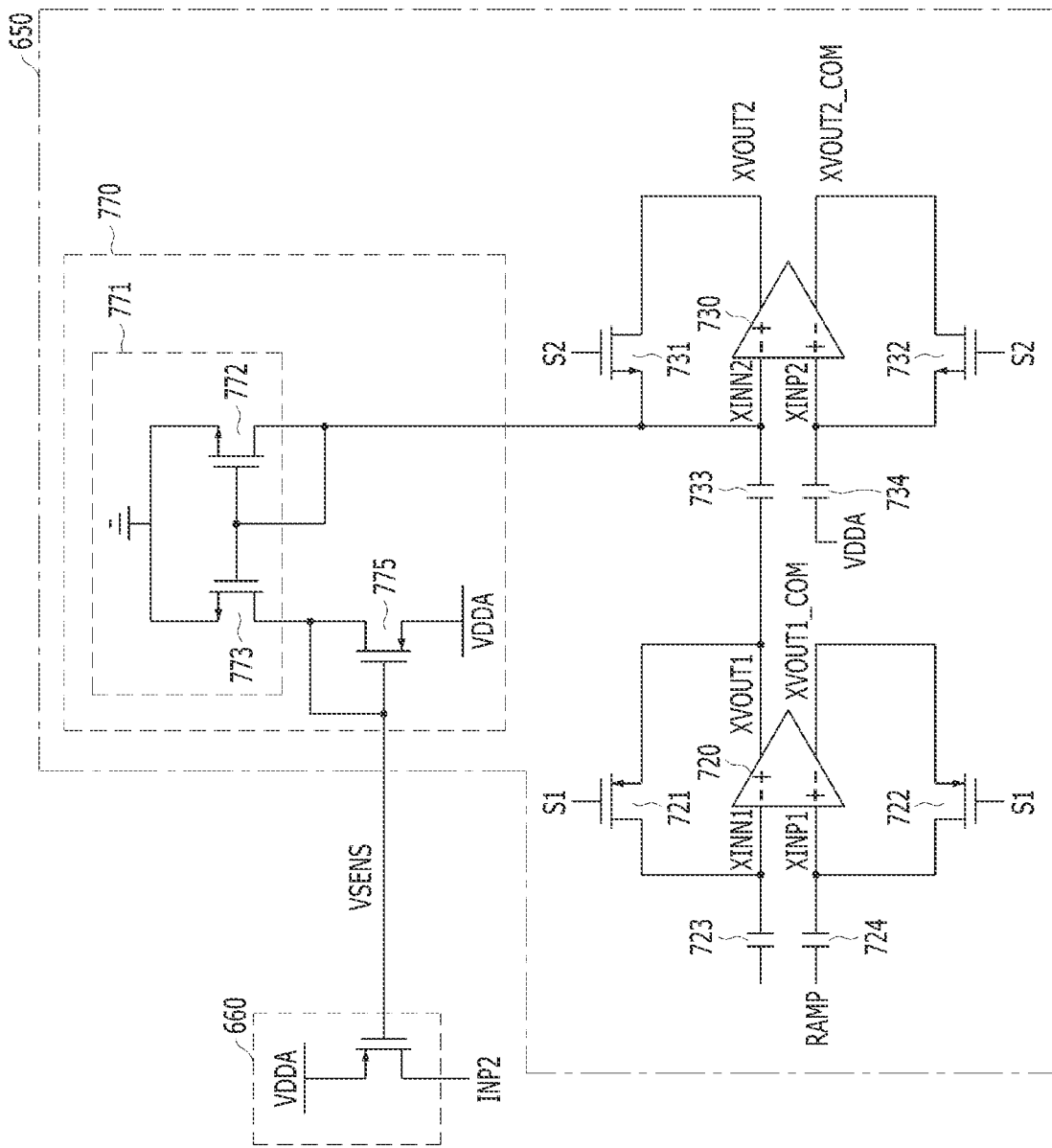
FIG. 7 is a block diagram illustrating a leakage current measurer and a leakage current generator, such as those shown in FIG. 6.

FIG. 7 is a block diagram illustrating the leakage current measurer 650 and the leakage current generator 660 shown in FIG. 6.

Referring to FIG. 7, the leakage current measurer 650 may measure the amount of the leakage current flowing through the input terminal INN2 of the second operation amplifier 130 in an indirect manner. The leakage current measurer 650 may include a dummy first operation amplifier 720, a dummy second operation amplifier 730, dummy switches 721, 722, 731 and 732, dummy capacitors 723, 724, 733 and 734, and a measurer 770.

Each of the constituent elements denoted by 'dummy' may be as its counterpart without the word 'dummy'. For example, the dummy second operation amplifier 730 may be formed the same as the second operation amplifier 130. The 'dummy' constituent elements may be provided to make the amount of dummy leakage current flowing through the input terminal XINN2 of the dummy second operation amplifier 730 be the same as the amount of leakage current flowing through the input terminal INN2 of the second operation amplifier 130. However, the 'dummy' constituent elements do not actually perform an analog-to-digital conversion operation. Therefore, the dummy first operation amplifier 720 need not be coupled to an actual pixel.

The measurer 770 may generate a leakage voltage VSENS corresponding to the dummy leakage current flowing through the input terminal XINN2 of the dummy second operation amplifier 730. The measurer 770 may include a current mirror 771 and a current voltage converter 775.

The current mirror 771 may include NMOS transistors 772 and 773, and the dummy leakage current flowing through a drain of the NMOS transistor 772 may be mirrored to a drain of the NMOS transistor 773 by a mirroring operation of the current mirror 771.

The current voltage converter 775 may include a PMOS transistor having a source terminal to which a power supply voltage VDDA is applied, and a drain coupled to a drain of the NMOS transistor 773, where the drain and the gate are coupled. The current voltage converter 775 may generate a leakage voltage VSENS, which is a voltage corresponding to the dummy leakage current mirrored to the drain terminal of the NMOS transistor 773.

The leakage current generator 660 may include a PMOS transistor that receives the leakage voltage VSENS at a gate and causes a current to flow from the power supply voltage terminal VDDA to the input terminal INP2. Since the gate of the PMOS transistor of the leakage current generator 660 receives the same voltage VSENS as the gate of the PMOS transistor 775 of the current voltage converter 775, current of the same amount as that of the PMOS transistor of the current voltage converter 775, that is, current of the same amount as that of the dummy leakage current may flow through the input terminal INP2.

Although FIG. 6 shows the image sensor 600 to include one second operation amplifier 130, the image sensor 600 may include a plurality of second operation amplifiers. In this case, there are also a plurality of leakage current generators 660, one for each of the second operation amplifiers, but the second operation amplifiers may share one leakage current measurer 650.

According to embodiments of the present invention, image sensors may produce digital images of a high quality.

While the present invention has been illustrated and described with respect to the specific embodiments, it will be apparent to those skilled in the art that various changes and modifications may be made without departing from the spirit and scope of the invention as defined in the following claims.

What is claimed is:

1. An analog-to-digital converter circuit, comprising:
    a first operation amplifier suitable for comparing a ramp voltage and a voltage to be converted so as to produce an amplification result and outputting the amplification result;
    a second operation amplifier suitable for comparing the amplification result transferred to a first input terminal with a reference voltage transferred to a second input terminal so as to produce a comparison result and outputting the comparison result;
    a leakage current measurer suitable for measuring a leakage current to the first input terminal; and
    a leakage current generator suitable for causing a current of the same amount as that of the leakage current measured by the leakage current measurer to flow to the second input terminal.

2. The analog-to-digital converter circuit of claim 1, wherein the leakage current measurer includes:
    a dummy second operation amplifier formed the same as the second operation amplifier; and
    a measurer suitable for generating a leakage voltage corresponding to a dummy leakage current flowing through a dummy first input terminal of the dummy second operation amplifier.

3. The analog-to-digital converter circuit of claim 2, wherein the measurer includes:
    a current mirror suitable for mirroring a current flowing through the dummy first input terminal; and
    a current voltage converter suitable for generating the leakage voltage corresponding to the mirrored current.

4. The analog-to-digital converter circuit of claim 3, wherein the current voltage converter includes:

a PMOS transistor including a drain through which the mirrored current flows, a source to which a pull-up voltage is applied, and a gate coupled to the drain.

5. The analog-to-digital converter circuit of claim 2, wherein the leakage current generator causes the current of the same amount as that of the leakage current to flow to the second input terminal in response to the leakage voltage.

6. The analog-to-digital converter circuit of claim 2, wherein the leakage current measurer further includes:
a dummy first operation amplifier which is formed the same as the first operation amplifier.

7. The analog-to-digital converter circuit of claim 1, further comprising:
a first switch suitable for coupling a positive output terminal of the first operation amplifier to a negative input terminal of the first operation amplifier during an auto-zeroing operation;
a second switch suitable for coupling a negative output terminal of the first operation amplifier to a positive input terminal of the first operation amplifier during the auto-zeroing operation;
a third switch suitable for coupling the first input terminal to a positive output terminal of the second operation amplifier during the auto-zeroing operation; and
a fourth switch suitable for coupling the second input terminal to a negative output terminal of the second operation amplifier during the auto-zeroing operation.

8. The analog-to-digital converter circuit of claim 7, wherein the third switch includes one or more PMOS transistors.

9. The analog-to-digital converter circuit of claim 1, further comprising:
a digital code generation circuit suitable for generating a digital code by using the comparison result.

10. An image sensor, comprising:
a pixel circuit;
a first operation amplifier suitable for comparing a ramp voltage with an output voltage of the pixel so as to produce a amplification result and outputting the amplification result;
a second operation amplifier suitable for comparing the amplification result transferred to a first input terminal with a reference voltage transferred to a second input terminal so as to produce a comparison result and outputting the comparison result;
a leakage current measurer suitable for measuring a leakage current to the first input terminal;
a leakage current generator suitable for causing a current of the same amount as that of the leakage current measured by the leakage current measurer to flow to the second input terminal; and
a digital code generation circuit suitable for generating image data by using the comparison result.

11. The image sensor of claim 10, wherein the leakage current measurer includes:
a dummy second operation amplifier formed the same as the second operation amplifier; and a measurer suitable for generating a leakage voltage corresponding to a dummy leakage current flowing through a dummy first input terminal of the dummy second operation amplifier.

12. The image sensor of claim 11, wherein the measurer includes:
a current mirror suitable for mirroring a current flowing through the dummy first input terminal; and
a current voltage converter suitable for generating the leakage voltage corresponding to the current mirrored by the current mirror.

13. The image sensor of claim 12, wherein the current voltage converter includes:
a PMOS transistor including a drain through which the mirrored current flows, a source to which a pull-up voltage is applied, and a gate coupled to the drain.

14. The image sensor of claim 11, wherein the leakage current generator causes the current of the same amount as that of the leakage current to flow to the second input terminal in response to the leakage voltage.

15. The image sensor of claim 11, wherein the leakage current measurer further includes:
a dummy first operation amplifier which is formed the same as the first operation amplifier.

16. The image sensor of claim 10, further comprising:
a first switch suitable for coupling a positive output terminal of the first operation amplifier to a negative input terminal of the first operation amplifier during an auto-zeroing operation;
a second switch suitable for coupling a negative output terminal of the first operation amplifier to a positive input terminal of the first operation amplifier during the auto-zeroing operation;
a third switch suitable for coupling the first input terminal to a positive output terminal of the second operation amplifier during the auto-zeroing operation; and
a fourth switch suitable for coupling the second input terminal to a negative output terminal of the second operation amplifier during the auto-zeroing operation.

17. The image sensor of claim 16, wherein the third switch includes one or more PMOS transistors.

18. A semiconductor device comprising:
an amplifying circuit suitable for performing an auto-zeroing operation, and amplifying a voltage difference between an input signal provided to a first input node of the amplifying circuit and a reference signal provided to a second input node of the amplifying circuit; and
a leakage current providing circuit suitable for providing a second leakage current to the second input node,
wherein the second leakage current is substantially the same as a first leakage current that flows to the first input node when a voltage level of the first input node drops below a ground voltage.

* * * * *